Dec. 16, 1969 RYOSAKU KOMATSU 3,484,658

TEMPERATURE COMPENSATED SEMICONDUCTOR RESISTOR

Filed Aug. 21, 1967

INVENTOR
Ryosaku Komatsu

BY Watson, Cole, Grindle & Watson
ATTORNEYS

United States Patent Office 3,484,658

Patented Dec. 16, 1969

3,484,658

TEMPERATURE COMPENSATED SEMICONDUCTOR RESISTOR

Ryosaku Komatsu, Kodaira, Tokyo, Japan, assignor to Nippon Telegraph and Telephone Public Corporation, Tokyo, Japan Filed Aug. 21, 1967, Ser. No. 661,972
Claims priority, application Japan, Aug. 25, 1966, 41/56,031
Int. Cl. H01l 3/00, 5/00, 15/00
U.S. Cl. 317—234 5 Claims

ABSTRACT OF THE DISCLOSURE

A temperature compensated semiconductor resistor wherein a diffused layer of a first impurity producing a deep impurity level and a diffused layer of a second impurity giving the same conduction type and producing a shallow impurity level are formed in close contact with each other in a semiconductor. Concentration of the first impurity on the semiconductor surface is made larger than that of the second impurity and the depth of the diffused layer of the former is made smaller than that of the latter so that the average resistivities of both impurity diffused layers may be superimposed to have a wide range of average resistivity of the resistor.

BACKGROUND OF THE INVENTION

Generally, in semiconductors containing impurities, the resistivity of the semiconductor, the conduction type of which is a p-type of n-type, is determined by the concentration and mobility of carriers therein contributing to the conduction. Further, the change of resistivity of the semiconductor with the temperature variation is determined by the temperature dependence of the carrier concentration and mobility and is controlled by the temperature dependence of the predominant one of both.

In a semiconductor containing an impurity producing a shallow impurity level in the semiconductor, the number of carriers will not vary but will be kept at a substantially constant concentration within a specific temperature range. But, due to the variation of the degree of scattering of carriers by thermal vibration of the semiconductor crystal lattice with the variation of the temperature, the mobility will decrease in inverse proportion to the $n$th power of the temperature with the rise of the temperature. On the other hand, in a semiconductor containing an impurity producing a deep impurity level, the carrier concentration will increase exponentially as the temperature rises within a specific temperature range but the mobility will be influenced by the lattice scattering and will decrease as the temperature rises.

Therefore, as the temperature dependence of the carrier concentration and mobility characteristics are opposite to each other, the contributions of both sources to a change of resistivity with temperature variation will be compensated with each other, when a semiconductor resistor contains a large amount of one kind of deep level impurity.

The above described explanation will be better understood by referring to the following typical references:

N. B. Hannay, "Semiconductors," Reinhold Publishing Corp., N.Y.; E. M. Conwell, "Properties of Germanium and Silicon (II)," Proc., I.R.E., vol. 46, pp. 1281–1300, June, 1958, and F. J. Morin and J. P. Maita, "Electrical Properties of Silicon Containing Arsenic and Boron," Phys. Rev., vol. 96, p. 28, October, 1954.

However, as detailed later, in such a method of adding a large amount of a single impurity as is described above, due mostly to the fact that there is a limitation to the solubility of the impurity into the semiconductor, it is impossible in principle to obtain a semiconductor resistor which has a desired resistivity and is substantially perfectly temperature-compensated.

According to a method of U.S. Patent 3,248,677 to L. P. Hunter et al., for compensating for the above described defects, a semiconductor resistor in which the range of desired resistivities is improved and which is substantially perfectly temperature-compensated can be obtained by uniform addition of respective proper concentrations of two kinds of impurities giving the same conduction type to the semiconductor and producing different impurity levels. However, the range of desired resistivities will be limited to the solubilities inherent to respective impurities and the interaction of high concentration carriers. Therefore, in order to obtain any resistivity in a wider range, it is necessary to select a combination of different impurities which is considerably difficult to practice.

An object of the present invention made by taking the above described points into consideration is to provide a semiconductor resistor temperature-compensated by forming two regions in which two different kinds of impurities are contained at respectively different concentration distributions in a semiconductor.

Another object of the present invention is to provide a temperature-compensated semiconductor resistor having respectively controlled surface concentrations, depth of the cross point of both concentration distributions, and depths of diffused layers of two different kinds of impurities.

A further object of the present invention is to provide a semiconductor resistor wherein the value of the resistivity and the temperature-compensation of the resistivity in the temperature range to be used can be controlled substantially independently of each other in a combination of two kinds of specific impurities.

Aside from being controlled by the kind of the added impurity and its mere uniform concentration or single concentration distribution in the conventional technique, the temperature-compensated resistivity of the semiconductor resistor of the present invention is defined by not only the kinds of the added impurities but also their concentration distributions consisting of a plurality of independently controllable parameters so that the range of desired available values may be remarkably wide and therefore the practical utility may be increased.

The above described objects and other features of the present invention will be better understood from the detailed explanation and claims with reference to the following drawings.

DESCRIPTION OF THE PREFERRED EMBODIMENTS

Figure 1:
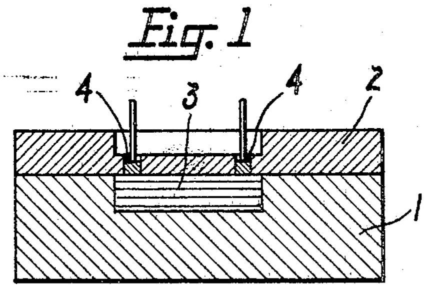
FIGURE 1 is a sectional sketch of a conventional semiconductor diffused resistor.

In FIGURE 1 showing a sectioned formation of a conventional semiconductor diffused resistor, 1 is an n-type silicon single crystal wafer body, 2 is a thin oxide film of silicon dioxide, 3 is a p-type diffused layer electrically insulated from the base 1 by a depletion layer of a p-n junction and having a concentration distribution of one kind of impurity decreasing inwardly from the surface and 4 are separate ohmic electrical contact connected to the p-type diffused layer.

The p-type diffused layer 3 will be generally formed by means of a diffusion of a single element onto the silicon base 1, for example, boron or arsenic which occupies a shallow impurity level of 0.045 ev. or 0.049 ev., in silicon, respectively, or indium or zinc which occupies a deep impurity level of 0.16 ev. of 0.31 ev., respectively.

As the carrier concentration distributed uniformly but so as to decrease inwardly from the surface, the resisitivity of this diffused resistor is expressed generally as an average resistivity $\bar{\rho}$ and is given by the following formula:

$$\bar{\rho}=\frac{Xj}{q}\left\{\int_0^{Xj}\mu\cdot N dx\right\}^{-1} \quad (1)$$

where $q$ is an electric charge, N is a hole concentration, $\mu$ is a mobility of the hole and $Xj$ is a depth of a diffused layer which is defined by the distance from the surface of a point at which the hole concentration and electron concentration are equal to each other.

Further, the temperature coefficient $\beta$ representing the temperature dependence of the average resistivity is expressed by the following relative formula:

$$\bar{\rho}_1=\bar{\rho}_0\{1+\beta(T_1-T_0)\} \quad (2)$$

wherein $\bar{\rho}_1$ is an average resistivity at a temperature $T_1$ and $\bar{\rho}_0$ is an average resistivity at an initial temperature $T_0$.

Figure 3:
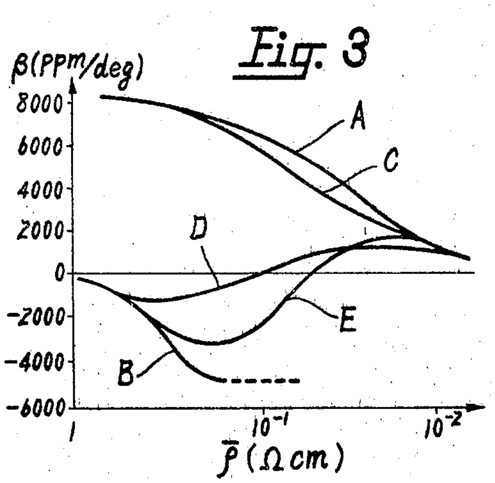
FIGURE 3 is a characteristic diagram showing the relation between the temperature coefficient and average resistivity for explaining the temperature dependences of resistivities and ranges of resistivities of the present invention and a conventional semiconductor resistor.

FIGURE 3 shows the relation between the temperature coefficient $\beta$ obtained at $T_0=20°$ C. and $T_1=70°$ C. in the Formula 2 and the range of average resistivities. In FIGURE 3, the curve A represents the relation between the average resistivity and temperature coefficient obtained by varying the concentration of boron which is used for a conventional diffused resistor and the curve B represents the same in case indium is used.

In the curve A, according to the above described explanation, with the increase of the amount of addition of boron, the average resistivity will decrease and the temperature coefficient will also decrease. But, as there is a limit to the solubility of boron into silicon, the curve A will not take a value of zero and further will not be able take a negative value of temperature coefficient. That is to say, the average resistivity will not be temperature-compensated enough to become independent of the temperature.

In the curve B, the temperature compensation is such that the temperature coefficient will become substantially zero only in the very close vicinity of a specific point at which the average resistivity is about 1Ω cm. However, it can not be attained at any desired average resistivity.

The features of the present invention made to improve the defects of the conventional diffused resistor shall be explained in detail in the following with reference to the drawings.

The present invention is a semiconductor resistor having an average resistivity temperature-compensated by addition, in a semiconductor, of both a first impurity producing a deep impurity level, and a second impurity of the same conduction type and producing a shallow impurity level, comprising a semiconductor base consisting of the first region containing said second impurity substantially more than said first impurity and the second region provided adjacent said first region and containing said first impurity substantially more than the second impurity: and a plurality of separated ohmic electrical contacts connected to one of the first and second regions. The first impurity has an ionizing energy of substantially more than 0.1 ev. in said semiconductor base and said second impurity has an ionizing energy of substantially less than 0.05 ev. in said semiconductor base. The first and second impurities being continuously distributed at respective substantially different concentration distributions decreasing inwardly through said first and second regions, the carrier concentrations thermally generated from said first and second impurities having equal values at the junction of said first and second regions. The carrier concentration thermally generated from said second impurity being substantially larger than the carrier concentration thermally generated from said first impurity on the surface of said first region and the depth of the diffused layer of said second impurity being substantially smaller than the depth of the diffused layer of said first impurity.

Figure 2:
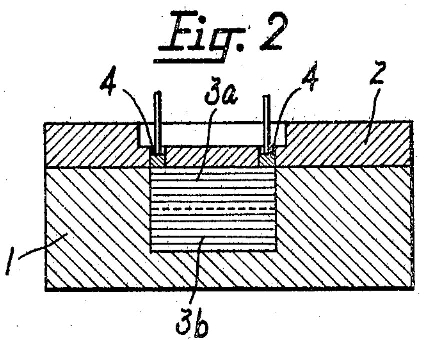
FIGURE 2 is a sectional sketch of a semiconductor resistor of the present invention.

In FIGURE 2, which is a sectional sketch showing the formation of a semiconductor resistor embodying the present invention, 1 is an n-type silicon base, 2 is a silicon dioxide film, **3*a* is the above mentioned first region, 3*b* is the above mentioned second region and 4 is each ohmic electrical contact separately provided on the surface of the first region 3*a*. The diffused resistor part is formed of two impurity diffused layers 3*a* and 3*b* which are electrically insulated from the n-type base 1 by a depletion layer of a p-n junction being present in the boundary of the n-type base 1** and the first and second regions.

The first region **3*a*, as a whole, contains an impurity of a small ionizing energy as, for example, boron more than an impurity of a large ionizing energy as, for example, inidum. On the contrary, the second region 3*b*** contains indium more than boron.

In forming the first region **3*a* and the second region 3*b***, by means of a known successive diffusion method or simultaneous diffusion method, indium and boron are diffused from the n-type silicon base surface so as to have a substantially normal distribution in which the concentration of each impurity will decrease inwardly.

Figure 4:
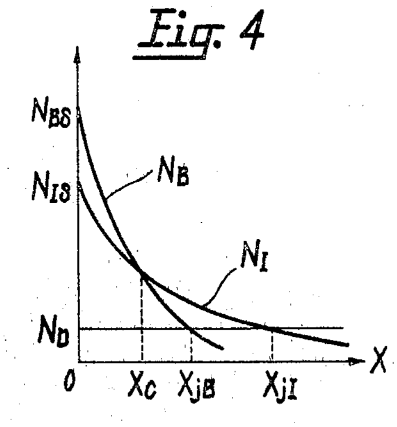
FIGURE 4 is a view showing carrier concentration distributions within a diffused layer for explaining the formation of a semiconductor resistor of the present invention.

The carrier concentration distributions thermally generated from the respective impurities in the above mentioned impurity diffused layers **3*a* and 3*b* will take such distributions as are shown, for example, in FIGURE 4 at room temperature. In FIGURE 4, the abscissa represents distances from the surface of the silicon base in an arbitrary scale (micron), the ordinate represents respective carrier concentrations in an arbitrary scale, $N_D$ is an electron concentration in the n-type silicon base 1, $N_I$ and $N_B$ are hole carrier concentration distributions thermally generated from indium and boron impurities, respectively, and $N_{IS}$ and $N_{BS}$ are respective values of $N_I$ and $N_B$ on the surface of the n-type silicon base 1. $X_{jI}$ and $X_{jB}$ are the points at which the hole carrier concentrations thermally generated from indium and boron are equal to the electron concentration $N_D$, respectively, and the distances thereof from the surface of the n-type silicon base 1** are defined to be the depths of the respective diffused layers. $X_C$ represents a position at which the respective hole carrier concentrations thermally generated from indium and boron impurities are equal to each other.

The carrier concentration distributions shown in FIGURE 4 are obtained, for example, as follows. An n-type silicon single crystal wafer containing an electron concentration of about $10^{15}$ cm.$^{-3}$ is kept at a fixed temperature of 1250 to 1400° C. in such inert gas current as argon. At the same time, an indium metal or indium oxide is placed in this inert gas. When the temperature of the indium source is elevated to 1,000 to 1,300° C., the indium vapor will be conveyed by the inert gas and will be diffused into the silicon single crystal wafer from the surface. In such case, the concentration of indium on the silicon surface will depend primarily on the temperature of the indium source. If the feed of the indium vapor is large enough, the higher the temperature, the larger the concentration. Further, the depth of the diffused layer of indium is determined by the temperature of the silicon base and the heating time. The higher the temperature of the base and the longer the heating time, the larger the depth of the diffused layer.

Now, when a sufficient amount of a boron compound as, for example, boron trioxide is deposited on the surface of the silicon single crystal wafer in which indium has been diffused as described above and is heated in an inert gas at a fixed temperature of 800 to 1,000° C., boron will be diffused in the silicon base. This temperature is low enough to have no influence on the concentration distribution of previously diffused indium. The concentration of boron on the silicon base surface is determined by the heating temperature. The depth of the diffused layer of boron is determined by the heating temperature and time.

As the relation at a certain temperature between the concentration of the impurity in the silicon base and the carrier concentration thermally generated there from is already known, by properly controlling the above described conditions, such carrier concentration distribution as is shown in FIGURE 4 can be easily obtained. In the above, there has been described a case in which boron is diffused in turn after indium. However, under proper conditions, it is possible to reverse this order. Also they can be diffused simultaneously.

The average resistivity $\bar{\rho}$ of the thus obtained semiconductor resistor of the present invention is expressed by $$\bar{\rho}=\frac{X_{jI}}{q}\left[\int_0^{X_C}\mu_B N_B dx+\int_{X_C}^{X_{jI}}\mu_I N_I dx\right]^{-1} \quad (3)$$

where the notations of the respective signs are the same as are given in Formula 1 and FIGURE 4.

If the average resistivities of diffused resistors which contain single impurity of boron and indium and have respective carrier concentration distributions as in FIGURE 4 are respectively $\bar{\rho}_B$ and $\bar{\rho}_I$, in case $N_{BS}$ is much larger than $N_{IS}$ as in FIGURE 4, the average resistivity $\bar{\rho}$ of the semiconductor resistor of the present invention will be approximately $$\bar{\rho}\doteqdot\frac{\bar{\rho}_I\bar{\rho}_B}{\left(1-\frac{X_C}{X_{jI}}\right)\bar{\rho}_B+\frac{X_C}{X_{jI}}\bar{\rho}_I} \quad (4)$$

from the Formulas 1 and 3. This show that the average resistivities $\bar{\rho}$ may be equivalently given as two parallelly combined different average resistivities.

Further, its temperature coefficient will be approximately given from the Formulas 2 and 4 by $$\beta\doteqdot\left\{\left(1-\frac{X_C}{X_{jI}}\right)\frac{\beta_I}{\bar{\rho}_I}+\frac{X_C}{{}_{jI}X}\left(\frac{\beta_B}{\bar{\rho}_B}\right)\right\}\bar{\rho} \quad (5)$$

where $\beta_I$ and $\beta_B$ represent the temperature coefficient of the corresponding diffused resistors having the average resistivities there of $\bar{\rho}_I$ and $\bar{\rho}_B$, respectively.

The boron impurity in the first region, from the surface of the silicon base to $X_C$, will predominantly contribute to the average resistivity of the semiconductor resistor of the present invention having such carrier concentration as in FIGURE 4. The total amount of indium predominant in the second region, from $X_C$ to $X_{jI}$ is so small that its contribution to the average resistivity combined by the Formula 4 will be substantially negligible. In other words, in this case, the value of the average resistivity will be able to be substantially independently controlled by the carrier concentration $N_{BS}$ thermally generated from the boron impurity on the silicon surface.

If the condition is selected according to the Formula 5 so that the positive temperature coefficient due to boron predominant in the above mentioned first region in the carrier concentration distributions shown in FIGURE 4 may be compensated by the negative temperature coefficient due to indium predominant in the above mentioned second region, a value of the temperature coefficient of the average resistivity close to zero will be easily obtained. In such a case, if the above mentioned $X_C$ is much smaller than $X_{jI}$, the temperature coefficient of this semiconductor resistor will be substantitlly independently controlled by the depth $X_{jI}$ of the diffused layer of indium.

In case the value of $X_C$ is equal to or larger than that of $X_{jI}$ in FIGURE 4, boron will become predominant over all and the relation between the average resistivity and the temperature coefficient is shown as the curve C in FIGURE 3 which slightly differs from the curve A, in case of only boron addition, due to the slight influence of indium.

In case $N_{BS}$ is made much larger than $N_{IS}$ and $X_C$ is made much smaller than $X_{jI}$ as shown in FIGURE 4, a substantially perfect temperature compensation will be attained as in the curve D in FIGURE 3. Further, under the same conditions as in the curve D, when $N_{BS}$ is made so small as to be close to $N_{IS}$, such characteristic as in the curve E will be also obtained. As the curve D is obtained by making $N_{BS}$, $N_{IS}$ and $X_{jI}$ constant by varying $X_{jB}$ related with $X_C$, it will be easily understood that, when the above mentioned $N_{BS}$, $N_{IS}$ and $X_{jI}$ are properly selected, there will be obtained a substantially perfectly temperature-compensated semiconductor resistor having a wide range of average resistivities.

In the case mentioned above $N_{BS}=10^{18}$ cm.$^{-3}$, $N_{IS}=2\times10^{-17}$ cm.$^{-3}$ and $X_{jI}=3\times10^{-4}$ cm. to $0.1\times10^{-4}$ cm., the characteristic of the curve D shown in FIGURE 3 was obtained.

Indium was diffused into a silicon single crystal wafer of an electron concentration of about $10^{15}$ cm.$^{-3}$ at 1,300° C. for 3 hours and then boron was successively diffused at 850° C. respectively for 33 minutes and 1 hour to obtain two semiconductor resistors *a* and *b*. Examples of the respective diffusion parameters, average resistivities and temperature coefficients of these two semiconductor resistors are shown in Table 1.

TABLE 1

| Diffusion parameters | Element a | Element b |
|---|---|---|
| $\rho_I$ in Ω cm | 0.74 | 0.74 |
| $X_{jI}$ in cm | $10.3\times10^{-4}$ | $10.3\times10^{-4}$ |
| $\beta_I$ in p.p.m./° C | −2354 | −2354 |
| $\rho_B$ in Ω cm | 0.032 | 0.021 |
| $X_{jB}$ in cm | $0.18\times10^{-4}$ | $0.22\times10^{-4}$ |
| $\beta_B$ in p.p.m./° C | 4200 | 4000 |
| $\rho$ in Ω cm.: | | |
| Measured value | 0.41 | 0.39 |
| Calculated value | 0.54 | 0.42 |
| $\beta$ in p.p.m./° C.: | | |
| Measured value | −380 | 100 |
| Calculated value | −371 | 395 |

In this case, $N_{BS}=4\times10^{19}$ cm.$^{-3}$, $N_{IS}=1\times10^{17}$ cm.$^{-3}$ and $X_{jI}=10\times10^{-4}$ cm. When $X_{jB}$ was $0.22\times10^{-4}$ cm., the temperature coefficient was substantially zero. The calculated values were obtained from the Formulas 4 and 5 and coincided well with the measured values.

The electron concentration of the above described n-type silicon base is about $10^{15}$ cm.$^{-3}$. However, if the electron concentration is so much less than the hole carrier concentration in the impurity diffused layers 3*a* and 3*b* as not to substantially contribute to the electric conduction of the semiconductor resistor, the electron concentration of the semiconductor base need not be specifically limited.

The above mentioned explanation has been made of the case of a formation in which the first and second regions are arranged in the direction of the depth of the semiconductor as in FIGURE 2. However, the present invention can be realized by two regions containing respective different impurities substantially parallelly arranged on the surface of a semiconductor base as shown in FIGURE 5.

Figure 5:
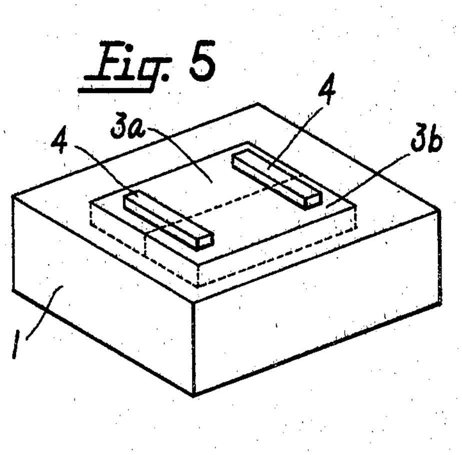
FIGURE 5 is a perspective view of an embodiment of the present invention.

In FIGURE 5, 1 is an n-type silicon base, 3*a* is a diffused layer of an impurity producing a shallow impurity level as, for example, boron, 3b is a diffused layer of an impurity producing a deep impurity level as, for example, indium and 4 are separate ohmic electrical contacts connected simultaneously to the above mentioned diffused layers 3a and 3b. Said diffused layers 3a and 3b have separately such respective carrier concentration distributions inwardly from the surfaces by the respective impurities as shown in FIGURE 4.

It will be readily apparent that the present invention may be also realized in a semiconductor resistor consisting of only the regions of 3a and 3b provided with electrodes 4 on one of them or both of them without any surrounding semiconductor 1 as shown in FIGURES 2 and 5.

The above explanation has been limited to a semiconductor silicon base, and the impurities indium and boron. However, the embodiment of the present invention is not limited to them. For example, generally, with silicon there are used elements having an ionizing energy of more than about 0.1 ev. as, for example, zinc (of 0.31 ev.) and elements having an ionizing energy of less than about 0.05 ev. as, for example, phosphorus (of 0.044 ev.), antimony (of 0.039 ev.) or arsenic (of 0.049 ev.).

What is claimed is:

1. In a semiconductor resistor having temperature compensated average resistivity, comprising; a semiconductor body containing both a first impurity producing a deep impurity level and a second impurity of the same conductivity type therewith and producing a shallow impurity level, the improvements comprising; said semiconductor body consisting of a first region containing said second impurity substantially more than said first impurity and a second region adjacent said first region containing said first impurity substantially more than the second impurity, a plurality of separated ohmic electrical contacts connected to one of said first and second regions, said first impurity having an ionizing energy of substantially more than 0.1 ev. in said semiconductor body, said second impurity having an ionizing energy of substantially less than 0.05 ev. in said semiconductor base, said first and second impurities being continuously distributed in respective substantially different concentrations decreasing inwardly through said first and second regions, the carrier concentrations thermally generated from said first and second impurities having equal values at the junction of said first and second regions, the carrier concentration thermally generated from said second impurity being substantially larger than the carrier concentration thermally generated from said first impurity on the surface of said first region, and the depth of the diffused layer of said second impurity being substantially smaller than the depth of the diffused layer of said first purity.

2. A semiconductor resistor according to claim 1 wherein at least one said semiconductor resistor constitutes a part of a semiconductor device, said device and said resistor, substantially isolated by a p-n junction therebetween.

3. A semiconductor resistor according to claim 1 wherein each of said plurality of electrical contacts is connected to both said first and second regions.

4. In a semiconductor resistor having temperature compensated average resistivity, comprising: a semiconductor body containing both a first impurity producing a deep impurity level and a second impurity of the same conductivity type therewith and producing a shallow impurity level, the improvements comprising a first region containing said first impurity at a predetermined concentration distribution decreasing inwardly, a second region containing said second impurity at a predetermined concentration distribution decreasing inwardly, a plurality of separated ohmic electrical contacts connected to both said first and second regions, said first and second regions being parallelly provided adjacent to each other on their sides, said first impurity having an ionizing energy of substantially more than 0.1 ev. in said semiconductor base, said second impurity having an ionizing energy of substantially less than 0.05 ev. in said semiconductor base, said first and second impurities being distributed in substantially different concentrations in said first and second regions, respectively, the carrier concentration thermally generated from said second impurity on the surface of said second region being substantially larger than the carrier concentration thermally generated from said first impurity on the surface of said first region, and the depth of the diffused layer of said second impurity being substantially smaller than the depth of the diffused layer of said first impurity.

5. A semiconductor resistor according to claim 4 wherein at least one said semiconductor resistor constitutes a part of a semiconductor device said device and said resistor, substantially isolated by a p-n junction therebetween.

References Cited

UNITED STATES PATENTS

| | | | |
|---|---|---|---|
| 2,648,805 | 8/1953 | Spinke et al. | 317—235 |
| 2,756,285 | 7/1956 | Shockley | 317—235 X |
| 2,940,022 | 6/1960 | Pankove | 317—235 |
| 2,993,998 | 7/1961 | Lehovec | 317—235 X |
| 3,029,366 | 4/1962 | Lehovec | 317—101 |
| 3,248,677 | 4/1966 | Hunter et al. | 317—234 X |

JAMES D. KALLAM, Primary Examiner

U.S. Cl. X.R.

317—235